(12) United States Patent
Tamiya et al.

(10) Patent No.: US 12,021,015 B2
(45) Date of Patent: Jun. 25, 2024

(54) THERMOSETTING RESIN COMPOSITION, METAL-CLAD LAMINATED PLATE, INSULATING SHEET, PRINTED WIRING BOARD, METHOD OF MANUFACTURING PRINTED WIRING BOARD, AND PACKAGE SUBSTRATE

(71) Applicant: Panasonic Intellectual Property Management Co., Ltd., Osaka (JP)

(72) Inventors: Hiroki Tamiya, Fukushima (JP); Koji Kishino, Fukushima (JP); Ryuji Takahashi, Fukushima (JP); Yasunori Hoshino, Fukushima (JP); Takahiro Yamada, Fukushima (JP); Shimpei Obata, Fukushima (JP); Hiroyuki Shiraki, Osaka (JP); Shinya Arakawa, Fukushima (JP); Shigetoshi Fujita, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1509 days.

(21) Appl. No.: 16/275,957

(22) Filed: Feb. 14, 2019

(65) Prior Publication Data

US 2019/0181081 A1 Jun. 13, 2019

Related U.S. Application Data

(62) Division of application No. 15/071,192, filed on Mar. 15, 2016, now abandoned.

(30) Foreign Application Priority Data

Mar. 31, 2015 (JP) .................................. 2015-071297

(51) Int. Cl.
*H01L 23/498* (2006.01)
*C08K 9/04* (2006.01)
*H01L 23/14* (2006.01)

(52) U.S. Cl.
CPC .......... *H01L 23/49827* (2013.01); *C08K 9/04* (2013.01); *H01L 23/145* (2013.01);
(Continued)

(58) Field of Classification Search
CPC ....... C08L 63/00; C08L 2203/20; C08K 9/04; H01L 23/49827; H01L 23/498
(Continued)

(56) References Cited

U.S. PATENT DOCUMENTS 6,350,952 B1 * 2/2002 Gaku .................. H01L 23/3128
257/E23.125
2006/0154078 A1 7/2006 Watanabe et al.
(Continued)

FOREIGN PATENT DOCUMENTS

CN 1798805 A 7/2006
CN 102311612 A 1/2012
(Continued)

OTHER PUBLICATIONS

Front page of Chinese Office Action and Search Report dated Jul. 2, 2019 for the related Chinese Patent Application No. 201610168517.0.
(Continued)

*Primary Examiner* — Tremesha S Willis
(74) *Attorney, Agent, or Firm* — Rimon P.C.

(57) ABSTRACT

A thermosetting resin composition according to the invention contains: a thermosetting resin component; and silica having an average particle diameter equal to or greater than 0.2 μm and treated with isocyanate. It is preferable that the content of the silica is in a range of 50% by mass to 300%
(Continued)

by mass with respect to the thermosetting resin component. It is also preferable that the thermosetting resin composition contains core shell rubber having content in a range of 20% by mass to 80% by mass with respect to the thermosetting resin component.

7 Claims, 1 Drawing Sheet

(52) U.S. Cl.
CPC ....... *C08L 2203/20* (2013.01); *C08L 2207/53* (2013.01); *H01L 2224/16225* (2013.01)

(58) Field of Classification Search
USPC .......................................................... 428/323
See application file for complete search history.

(56) References Cited

U.S. PATENT DOCUMENTS

| | | | |
|---|---|---|---|
| 2007/0027233 A1 | 2/2007 | Yamaguchi et al. | |
| 2010/0216913 A1 | 8/2010 | Morita et al. | |
| 2016/0209284 A1* | 7/2016 | Takayama ............ | G01L 19/0069 |
| 2016/0255717 A1* | 9/2016 | Furutani ............. | H01L 21/4857 |
| | | | 361/783 |

FOREIGN PATENT DOCUMENTS

| | | |
|---|---|---|
| CN | 102675601 A | 9/2012 |
| CN | 102827566 A | 12/2012 |
| JP | 2001-123044 A | 5/2001 |
| JP | 2008-150578 A | 7/2008 |
| JP | 2009-051969 A | 3/2009 |
| JP | 2010-053334 A | 3/2010 |
| TW | 201202334 A | 1/2012 |
| WO | 2011/111847 A1 | 9/2011 |

OTHER PUBLICATIONS

Chinese Eversun—PC modified protocol designer's blog, "Mitsubishi Rayon Cold-resistance and Weather resistance Organosilicone PC Flexibilizer Nuclear Shell Structure Chart (Partial English Translation)", published on Nov. 25, 2012 (http://blog.sina.com.cn/s/blog_ae8e8fd00101dic5.html).

English Translation of Chinese Search Report dated Feb. 2, 2019 for the related Chinese Patent Application No. 201610168517.0.

* cited by examiner

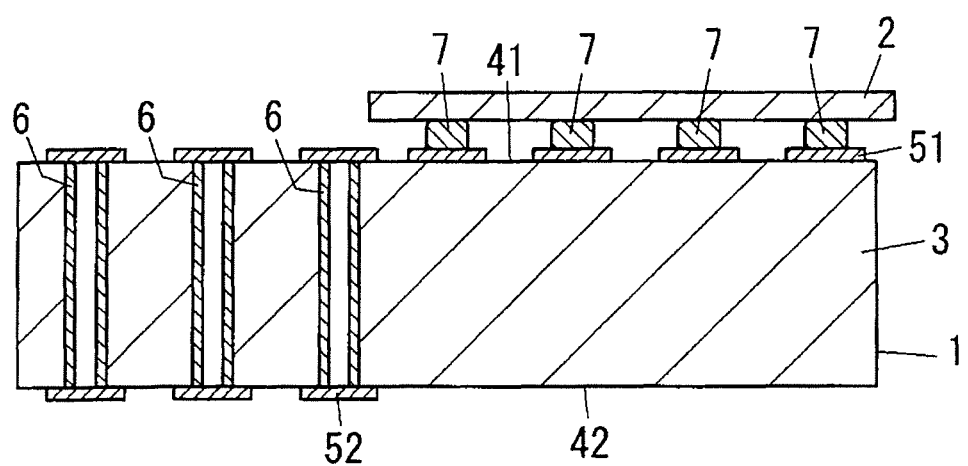

THERMOSETTING RESIN COMPOSITION, METAL-CLAD LAMINATED PLATE, INSULATING SHEET, PRINTED WIRING BOARD, METHOD OF MANUFACTURING PRINTED WIRING BOARD, AND PACKAGE SUBSTRATE

This application is a divisional of U.S. patent application Ser. No. 15/071,192, filed Mar. 15, 2016, which claims the benefit of Japanese Application No. 2015-071297, filed on Mar. 31, 2015, the disclosures of which are incorporated in their entirety by reference herein.

BACKGROUND OF THE INVENTION

1. Field of the Invention

The present invention relates to a thermosetting resin composition, a metal-clad laminated plate, an insulating sheet, a printed wiring board, a method of manufacturing a printed wiring board, and a package substrate. The invention specifically relates to a thermosetting resin composition containing silica, a metal-clad laminated plate including an insulating layer formed of the thermosetting resin composition, an insulating sheet including an insulating layer formed of the thermosetting resin composition, a printed wiring board including an insulating layer formed of the thermosetting resin composition, a method of manufacturing the printed wiring board, and a package substrate including the printed wiring board.

2. Description of the Related Art

A package substrate including a printed wiring board and a semiconductor chip mounted on the printed wiring board is easily warped. This is because a coefficient of thermal expansion (CTE) of the semiconductor chip is smaller than that of a typical printed wiring board. Therefore, an insulating layer of a printed wiring board has been manufactured using a thermosetting resin composition containing silica, in order to prevent the warpage of the package substrate (see Japanese Patent unexamined Publication No. 2008-150578). Thus, a modulus of elasticity of the insulating layer is increased and the warpage is prevented.

SUMMARY OF THE INVENTION

However, when holes for through holes are formed in a printed wiring board including an insulating layer containing silica, an inner wall of the hole may be excessively affected, in a case of performing a desmear treatment with respect to the holes. When the inner wall of the hole is excessively affected, failures in formation of through holes may easily occur, diameters of through holes may vary, and it is difficult to realize fine conductive wirings.

The invention is made in consideration of these circumstances and an object thereof is to provide a thermosetting resin composition which contains silica but forms a hardened material having high resistance to the desmear treatment, a metal-clad laminated plate which includes an insulating layer containing the hardened material of the thermosetting resin composition, an insulating sheet which is formed of the insulating layer containing the hardened material of the thermosetting resin composition, a printed wiring board which includes the insulating layer containing the hardened material of the thermosetting resin composition, and a method of manufacturing a printed wiring board using the metal-clad laminated plate.

According to an aspect of the invention, there is provided a thermosetting resin composition which contains a thermosetting resin component and silica treated with isocyanate having an average particle diameter equal to or greater than 0.2 μm.

According to another aspect of the invention, there is provided a metal-clad laminated plate including an insulating layer containing a hardened material of a thermosetting resin composition, and a metal foil.

According to still another aspect of the invention, there is provided an insulating sheet formed of an insulating layer containing a hardened material of a thermosetting resin composition.

According to still another aspect of the invention, there is provided a printed wiring board including an insulating layer containing a hardened material of a thermosetting resin composition, and conductive wirings.

According to still another aspect of the invention, there is provided a method of manufacturing a printed wiring board including forming holes penetrating through an insulating layer of a metal-clad laminated plate, and performing a desmear treatment on an inner wall of each of the holes.

According to still another aspect of the invention, there is provided a method of manufacturing a printed wiring board including forming holes penetrating through an insulating layer of an insulating sheet, and performing a desmear treatment on an inner wall of each of the holes.

According to still another aspect of the invention, there is provided a package substrate including a printed wiring board, and a semiconductor chip mounted on the printed wiring board.

According to the aspect of the invention, it is possible to obtain a thermosetting resin composition which can form a hardened material having high resistance to the desmear treatment, even when containing silica.

According to the aspect of the invention, it is also possible to obtain a metal-clad laminated plate, an insulating sheet, a printed wiring board, and a package substrate which include an insulating layer having high resistance to the desmear treatment, even when containing silica.

BRIEF DESCRIPTION OF DRAWING

The FIGURE is a sectional view showing a package substrate of one exemplary embodiment of the invention.

DETAILED DESCRIPTION OF THE PREFERRED EMBODIMENT

A thermosetting resin composition according to the exemplary embodiment contains a thermosetting resin component and silica. An average particle diameter of silica is equal to or greater than 0.2 μm and silica is treated with isocyanate.

In the exemplary embodiment, since the thermosetting resin composition contains silica, a hardened material of the thermosetting resin composition can have a high modulus of elasticity and an insulating layer containing the hardened material can also have a high modulus of elasticity. In a case where the thermosetting resin composition contains a solvent, the hardened material of the thermosetting resin composition is a hardened material having a component excluding the solvent in the thermosetting resin composition. Accordingly, a package substrate obtained by mounting a semiconductor chip on a printed wiring board including such an insulating layer is hardly warped due to a difference in coefficients of thermal expansion (hereinafter, also referred to as a CTE) between the semiconductor chip and the printed wiring board.

Since silica is treated with isocyanate, even when holes are formed in the insulating layer containing the hardened material and a desmear treatment is performed with respect to an inner wall of the hole, it is less likely that the inner wall of the hole will be excessively affected. That is, resistance to the desmear treatment of the insulating layer is increased. This may be because particles of silica are hardly separated from the inner wall of the hole by performing a treatment with isocyanate. Therefore, it is possible to prevent failures of formation of through holes in the printed wiring board including the insulating layer.

As described above, it is necessary that the average particle diameter of silica is 0.2 μm or greater. When the average particle diameter thereof is less than 0.2 μm, the particles of silica are easily separated from the inner wall of the hole at the time of the desmear treatment, the inner wall of the hole is easily excessively affected, and voids may be generated in the insulating layer due to deterioration in fluidity of the thermosetting resin composition.

The composition of the thermosetting resin composition according to the exemplary embodiment will be described in detail.

The thermosetting component in the thermosetting resin composition is a component which is cured by heat. The thermosetting component, for example, contains a thermosetting resin and a hardener.

The thermosetting resin can contain at least one kind of component selected from a group consisting of an epoxy resin, a phenolic resin, an imide resin, a cyanate ester resin, an isocyanate resin, a modified polyphenylene ether resin, a benzoxazine resin, and an oxetane resin, for example. In a case where the thermosetting resin contains an epoxy resin, the epoxy resin can contain at least one kind of component selected from a group consisting of a bisphenol type epoxy resin such as a bisphenol A type epoxy resin, a bisphenol F type epoxy resin, and a bisphenol S type epoxy resin; a novolac type epoxy resin such as a phenol novolac type epoxy resin and a cresol novolac type epoxy resin; an arylalkylene type epoxy resin such as a biphenyl type epoxy resin, a xylylene type epoxy resin, a phenol aralkyl type epoxy resin, a biphenyl aralkyl type epoxy resin, a biphenyl dimethylene type epoxy resin, a trisphenolmethane novolac type epoxy resin, a glycidyl ether, trifunctional or tetrafunctional glycidyl amines, and a tetramethyl biphenyl type epoxy resin; a naphthalene skeleton-modified epoxy resin such as a naphthalene skeleton-modified cresol novolac type epoxy resin, a methoxynaphthalene-modified cresol novolac type epoxy resin, and a methoxynaphthalene dimethylene type epoxy resin; an anthracene type epoxy resin; a dicyclopentadiene type epoxy resin; a norbornene type epoxy resin; a fluorene type epoxy resin; and a flame-retarded epoxy resin obtained by performing halogenation of these resins, for example.

The hardened material can contain at least one kind of component selected from a group consisting of dicyandiamide and a multi-functional phenolic compound, for example. In this case, excellent electrical characteristics, toughness, flexibility, and adhesiveness can be applied to the insulating layer formed of the thermosetting resin composition and stress in the insulating layer is easily alleviated, in a case where this insulating layer is heated. When the hardener contains phenol novolac, it is possible to obtain excellent resistance to the desmear treatment while preventing a decrease of a glass transition point of the insulating layer. When a decrease of a glass transition point of the insulating layer can be prevented, a decrease in a modulus of elasticity of the insulating layer at the time of heating is prevented, and accordingly, warpage of the metal-clad laminated plate, the printed wiring board, and the package substrate is particularly prevented. It is preferable that the content of the hardener in the thermosetting resin composition is in a range of 4 parts by mass to 70 parts by mass with respect to 100 parts by mass of the thermosetting resin.

The thermosetting resin composition may contain a hardening accelerator. The hardening accelerator can contain at least one kind of component selected from a group consisting of an organic acid metal salt such as an imidazole compound, an amine compound, a thiol compound, and metal soap.

Silica in the thermosetting resin composition will be described. As described above, the average particle diameter of silica is equal to or greater than 0.2 μm. The average particle diameter is a particle diameter (so-called median diameter) which is 50% of an integrated value calculated from a particle size distribution acquired by a laser diffraction and scattering method. An upper limit of the average particle diameter of silica is not particularly limited, and when the average particle diameter is equal to or smaller than 10 μm, an inner surface of the through hole can be smoothed.

As described above, silica is treated with isocyanate. Isocyanate can contain 3-isocyanate propyl triethoxysilane, for example. As a method of performing a treatment with respect to silica with isocyanate, a method of dipping silica in a solution containing isocyanate is used, for example.

It is preferable that the content of silica is in a range of 50% by mass to 300% by mass with respect to the thermosetting resin component. In this case, a modulus of elasticity of the insulating layer and a modulus of elasticity of an insulating sheet formed of the insulating layer are appropriately adjusted while ensuring excellent formability of the thermosetting resin composition, and accordingly, it is possible to effectively prevent warpage of the package substrate.

The thermosetting resin composition may further contain an inorganic filler other than silica. Examples of the inorganic filler other than silica include aluminum hydroxide, magnesium hydroxide, aluminum silicate, magnesium silicate, talc, clay, and mica.

It is preferable that the thermosetting resin composition contains core shell rubber. In this case, it is possible to decrease the CTE of the hardened material and also decrease the CTE of the insulating layer containing the hardened material. Accordingly, the package substrate is further hardly warped due to a difference in the CTEs between the semiconductor chip and the printed wiring board. In addition, when the thermosetting resin composition contains the core shell rubber, adhesiveness between the insulating layer and metal foil or conductive wirings hardly decreases in a case where the insulating layer is heated, and even when the insulating layer is heated to 150° C., for example, excellent adhesiveness between the insulating layer and metal foil or conductive wirings is maintained.

The core shell rubber is made of rubber particles, each of which includes a core part and a shell part coating the core part. The core part is, for example, formed of one or more kinds of materials selected from a group consisting of a silicon resin, an acrylic resin, butadiene rubber, and isoprene rubber. The shell part is, for example, formed of at least one material of a polymethacrylate resin such as polymethylmethacrylate (PMMA) and polystyrene.

It is preferable that the content of the core shell rubber is in a range of 20% by mass to 80% by mass with respect to the thermosetting resin component. When the content of the core shell rubber is equal to or greater than 20% by mass with respect to the thermosetting resin component, the CTE of the insulating layer is particularly decreased. In addition, when the content of the core shell rubber is equal to or smaller than 80% by mass with respect to the thermosetting resin component, it is possible to ensure excellent formability of the thermosetting resin composition.

The thermosetting resin composition may contain a thermoplastic resin, a flame retardant, a colorant, a coupling agent, and the like, if necessary.

The thermosetting resin composition may contain a solvent. The solvent can contain at least one component selected from a group consisting of ethers such as ethylene glycol monomethyl ether, acetone, methyl ethyl ketone (MEK), dimethylformamide, benzene, and toluene.

Components configuring the thermosetting resin composition are combined with each other, stirred, and mixed with each other, and accordingly, the thermosetting resin composition can be obtained.

A prepreg including a base material and a resin layer can be obtained by using the thermosetting resin composition. The resin layer is a semi-hardened material of the thermosetting resin composition which impregnates the base material. The thermosetting resin composition impregnates the base material and the thermosetting resin composition is heated at a temperature in a range of 110° C. to 140° C., for example, to vaporize the solvent for semi-hardening, and accordingly, a prepreg can be obtained. The base material is, for example, a woven fabric formed of a glass fiber or an organic fiber, or a non-woven fabric. A resin content of the prepreg, that is, a rate of the semi-hardened material (resin layer) of the thermosetting resin composition in the prepreg is in a range of 30% by mass to 80% by mass with respect to the entire prepreg, for example.

It is possible to obtain a metal-clad laminated plate, an insulating sheet, and a printed wiring board including the insulating layer containing the hardened material of the thermosetting resin composition using this prepreg.

The metal-clad laminated plate, for example, includes an insulating layer, and a metal foil on one surface (hereinafter, referred to as a first surface) of the insulating layer in a thickness direction. The metal-clad laminated plate may further include a metal foil on a surface (hereinafter, referred to as a second surface) which is on a side opposite to the first surface of the insulating layer. The insulating layer contains the hardened material of the prepreg. Each metal foil is a copper foil, a silver foil, an aluminum foil, or a stainless steel foil, for example. A thickness of each metal foil is, for example, in a range of 3 μm to 105 μm and preferably in a range of 12 μm to 35 μm.

The metal foil is overlapped with one prepreg or a laminate of the plurality of prepregs and a resultant material is heated and pressed to manufacture the metal-clad laminated plate. In this case, one prepreg is hardened or a laminate is hardened to form an insulating layer. In conditions of heating and pressing, a heating temperature is in a range of 140° C. to 200° C., a pressing pressure is in a range of 0.5 MPa to 5.0 MPa, and a treatment time is in a range of 40 minutes to 240 minutes, for example.

The insulating sheet is a member formed of only the insulating layer. For example, one prepreg or a laminate of the plurality of prepregs is heated and pressed to manufacture the insulating sheet. In this case, one prepreg is hardened or a laminate is hardened to form an insulating layer.

In conditions of heating and pressing, a heating temperature is in a range of 140° C. to 200° C., a pressing pressure is in a range of 0.5 MPa to 5.0 MPa, and a treatment time is in a range of 40 minutes to 240 minutes, for example.

The insulating sheet may be obtained by forming the thermosetting resin composition in a sheet shape, drying, if necessary, and heating the sheet-like material to be hardened.

The printed wiring board, for example, includes the insulating layer and conductive wirings on the first surface of the insulating layer. In the exemplary embodiment, the printed wiring board also includes conductive wirings on the second surface of the insulating layer. In the exemplary embodiment, the printed wiring board further includes through holes.

The printed wiring board is manufactured using the metal-clad laminated plate as a material, for example. In this case, at the time of manufacturing the printed wiring board, first, holes penetrating through the insulating layer and the metal foil are formed in the metal-clad laminated plate by an appropriate method such as drilling or laser beam machining, for example. In the exemplary embodiment, since adhesiveness between the insulating layer and the metal foil is hardly decreased, even when the insulating layer is heated, the metal foil is hardly peeled from the metal-clad laminated plate, even when holes are formed by laser beam machining.

The inner wall of the hole is subjected to a desmear treatment. The desmear treatment can be performed using a desmear solution containing permanganate or the like. Then, conductive wirings are formed by performing a treatment with respect to the metal foil by a subtractive process. The through holes are formed by forming a hole plating on the inner wall of the hole. Accordingly, a printed wiring board including the insulating layer, the conductive wirings, and the through holes are obtained.

The printed wiring board may be manufactured using the insulating sheet as a material. In this case, at the time of manufacturing the printed wiring board, first, holes penetrating through the insulating sheet (that is, the insulating layer) are formed by an appropriate method such as drilling or laser beam machining, for example. The inner wall of the hole is subjected to a desmear treatment. The desmear treatment can be performed by a well-known method using a well-known desmear solution containing permanganate or the like. Then, conductive wirings are formed by performing a treatment with respect to the insulating sheet by an additive process. The through holes are formed by forming a hole plating on the inner wall of the hole. Accordingly, a printed wiring board including the insulating layer, the conductive wirings, and the through holes are obtained.

When the printed wiring board is manufactured as described above, since the insulating layer contains the hardened material of the thermosetting resin composition in the exemplary embodiment, the inner wall of the hole is not excessively affected, even when the desmear treatment is performed with respect to the inner wall of the hole. Thus, in the exemplary embodiment, failures in formation of through holes rarely occur.

The printed wiring board may be a multilayer printed wiring board including a plurality of insulting layers. In this case, at least one of the plurality of insulating layers may contain the hardened material of the thermosetting resin composition according to the exemplary embodiment. It is particularly preferable that all of the plurality of insulating layers contain the hardened material of the thermosetting resin composition according to the exemplary embodiment. The multilayer printed wiring board is obtained by forming multi-layers of a core material including an insulating layer and conductive wirings by a build-up process, for example.

It is possible to obtain a package substrate using the printed wiring board. An example of the package substrate is shown in the FIGURE. This package substrate includes printed wiring board 1 and semiconductor chip 2 mounted on printed wiring board 1. Printed wiring board 1 includes insulating layer 3, conductive wirings 51 (hereinafter, referred to as first conductive wirings 51) on first surface 41 of insulating layer 3, and conductive wirings 52 (hereinafter, referred to as second conductive wirings 52) on second surface 42 of insulating layer 3. Printed wiring board 1 further includes through holes 6 which electrically connect first conductive wirings 51 and second conductive wirings 52 to each other. Semiconductor chip 2 includes bumps 7. Semiconductor chip 2 is mounted on printed wiring board 1 in a face-down manner so that the semiconductor chip opposes first surface 41 and bumps 7 of semiconductor chip 2 are electrically connected to first conductive wirings 51. In the exemplary embodiment, since insulating layer 3 of printed wiring board 1 contains the hardened material of the thermosetting resin composition and the thermosetting resin composition contains silica, a modulus of elasticity of insulating layer 3 is high. Accordingly, the package substrate is hardly warped due to a difference in the CTEs between semiconductor chip 2 and printed wiring board 1. In addition, when the thermosetting resin composition contains the core shell rubber, it is possible to decrease the CTE of insulating layer 3. Therefore, it is possible to decrease a difference in the CTEs between insulating layer 3 and semiconductor chip 2 and further reduce warpage occurring due to a difference in the CTEs between semiconductor chip 2 and printed wiring board 1.

It is preferable that a modulus of elasticity of the insulating layer of the metal-clad laminated plate and a modulus of elasticity of the insulating sheet formed of the insulating layer are in a range of 20 GPa to 50 GPa. In this case, warpage of the package substrate is effectively prevented. Such a modulus of elasticity of the insulating layer can be achieved by adjusting the content of silica in the thermosetting resin composition to be in a range of the exemplary embodiment, for example.

It is preferable that coefficients of thermal expansion of the insulating layer of the metal-clad laminated plate and the insulating sheet formed of the insulating layer in a direction orthogonal to the thickness direction is equal to or smaller than 10 ppm/° C. In this case, warpage of the package substrate is further prevented. Such coefficients of thermal expansion of the insulating layer can be achieved by adjusting the content of core shell rubber in the thermosetting resin composition to be in a range of the exemplary embodiment, for example.

EXAMPLES

Hereinafter, the invention according to this disclosure will be described in detail with reference to the examples.

Thermosetting Resin Composition

In respective examples and comparative examples, components shown in the following table are combined with each other, diluted using a solvent (methyl ethyl ketone), stirred, and mixed with each other for homogenization, and accordingly a thermosetting resin composition is prepared. Details of the components shown in the table are as follows.

Epoxy resin 1: tetrafunctional naphthalene type epoxy resin (EPICLON HP-4710 manufactured by DIC Corporation)

Hardener: phenol novolac (TD-2090 manufactured by DIC Corporation)

Hardening accelerator: 2-ethyl-4-methylimidazole (2E4MZ)

Core shell rubber: silicone-acryl composite rubber (SRK200A manufactured by Mitsubishi Rayon Co., Ltd.)

Acryl: SG-80H manufactured by Nagase ChemteX Corporation

Silica 1: product obtained by performing a surface treatment with isocyanate, average particle diameter of 0.1 µm, manufactured by Admatechs Co., Ltd.

Silica 2: product obtained by performing a surface treatment with isocyanate, average particle diameter of 0.2 µm, manufactured by Admatechs Co., Ltd.

Silica 3: product obtained by performing a surface treatment with isocyanate, average particle diameter of 2 µm, SC-610G-GND manufactured by Admatechs Co., Ltd.

Silica 4: product obtained by performing a surface treatment with isocyanate, average particle diameter of 12 µm, manufactured by Admatechs Co., Ltd.

Silica 5: product obtained by performing a surface treatment with an epoxy compound, average particle diameter of 2 µm, manufactured by Admatechs Co., Ltd.

Silica 6: product obtained by performing a surface treatment with an amino compound, average particle diameter of 2 µm, manufactured by Admatechs Co., Ltd.

Silica 7: product obtained by performing a surface treatment with a vinyl compound, average particle diameter of 2 µm, manufactured by Admatechs Co., Ltd.

An S glass fiber woven fabric is impregnated with the thermosetting resin composition and the thermosetting resin composition is heated at 160° C. for 300 seconds, and accordingly, a prepreg having a thickness of 100 µm and a resin content of 45% by mass is obtained.

A laminate obtained by laminating two sheets of this prepreg is interposed between two sheets of copper foil having a thickness of 12 µm and heat-pressed under the conditions of a heating temperature of 200° C., a pressing pressure of 30 MPa, and a treatment time of 120 minutes. Therefore, a metal-clad laminated plate is obtained.

Evaluation Test

The following evaluation test is performed with respect to the metal-clad laminated plate obtained in the respective examples and comparative examples.

(1) Resistance to Desmear

The copper foil is etched and removed from the metal-clad laminated plate to obtain an unclad material formed of the insulating layer. A sample having a length of 100 mm and a width of 100 mm is cut from the unclad material, this sample is subjected to the desmear treatment, and an amount decreased in weight of the sample generated by the desmear treatment is measured. The desmear treatment is performed under the standard conditions for FR-4 manufactured by Rohm and Haas Company.

(2) Evaluation of Adhesiveness at the Time of Heating

The adhesive strength of the copper foil in the metal-clad laminated plate at 150° C. is measured based on IPC TM650 2.4.8.

(3) CTE Measurement

The copper foil is etched and removed from the metal-clad laminated plate to obtain an unclad material formed of the insulating layer. The CTE of the unclad material in a direction orthogonal to the thickness direction in a temperature range of 50° C. to 250° C. is measured. The measurement is performed by a thermal mechanical analysis method (TMA method) based on IPC TM650 2.4.41.

(4) Modulus of Elasticity

The copper foil is etched and removed from the metal-clad laminated plate to obtain an unclad material formed of the insulating layer.
A sample having a length of 100 mm and a width of 25 mm is cut from the unclad material and a modulus of elasticity (bending elastic modulus) of this sample at 250° C. is measured based on JIS C6481.

(5) Formability

The metal-clad laminated plate is cut and a cross section is observed by an SEM, and accordingly the presence or absence of voids and scratches in the insulating layer is checked. As a result, a case where no voids and scratches are observed is evaluated as "A" and a case where at least one of voids and scratches is observed is evaluated as "B".

(6) Via Shape

Holes are formed in the metal-clad laminated plate by laser beam machining under conditions of output of 13 W per operation and performing irradiation at 10 μs five times. Then, the metal-clad laminated plate is cut so as to bisect the hole, the inner wall of the hole is observed, and the presence or absence of abnormal irregularities on the inner wall is observed. As a result, a case where no abnormal irregularities are observed is evaluated as "A" and a case where abnormal irregularities are observed is evaluated as "B".

TABLE 1

|  |  | Examples | | | | | | | | | | Comparative Examples | | | |
| --- | --- | --- | --- | --- | --- | --- | --- | --- | --- | --- | --- | --- | --- | --- | --- |
|  |  | 1 | 2 | 3 | 4 | 5 | 6 | 7 | 8 | 9 | 10 | 1 | 2 | 3 | 4 |
| Composition (parts by mass) | Epoxy resin 1 (tetrafunctional naphthalene type) | 60 | 60 | 60 | 60 | 60 | 60 | 60 | 60 | 60 | 60 | 60 | 60 | 60 | 60 |
|  | Hardener (phenol novolac) | 40 | 40 | 40 | 40 | 40 | 40 | 40 | 40 | 40 | 40 | 40 | 40 | 40 | 40 |
|  | Hardening accelerator (2E4MZ) | 0.1 | 0.1 | 0.1 | 0.1 | 0.1 | 0.1 | 0.1 | 0.1 | 0.1 | 0.1 | 0.1 | 0.1 | 0.1 | 0.1 |
|  | Core shell rubber (silicone-acryl composite rubber) | — | 50 | 18 | 22 | 78 | 83 | 50 | 50 | 50 | 50 | 50 | 50 | 50 | 50 |
|  | Acryl | 50 | — | — | — | — | — | — | — | — | — | — | — | — | — |
|  | Silica 1 (isocyanate-treated product having particle diameter of 0.1 μm) | — | — | — | — | — | — | — | — | — | — | 100 | — | — | — |
|  | Silica 2 (isocyanate-treated product having particle diameter of 0.2 μm) | — | — | — | — | — | — | — | 100 | — | — | — | — | — | — |
|  | Silica 3 (isocyanate-treated product having particle diameter of 2 μm) | 100 | 100 | 100 | 100 | 100 | 100 | — | — | 40 | 320 | — | — | — | — |
|  | Silica 4 (isocyanate-treated product having diameter particle of 12 μm) | — | — | — | — | — | — | 100 | — | — | — | — | — | — | — |
|  | Silica 5 (epoxy-treated product having particle diameter) of 2 μm | — | — | — | — | — | — | — | — | — | — | — | 100 | — | — |
|  | Silica 6 (amino-treated product having particle diameter of 2 μm) | — | — | — | — | — | — | — | — | — | — | — | — | 100 | — |
|  | Silica 7 (vinyl-treated product having particle diameter of 2 μm) | — | — | — | — | — | — | — | — | — | — | — | — | — | 100 |
| Evaluation | Resistance to Desmear (mg/cm$^2$) | 0.25 | 0.25 | 0.25 | 0.25 | 0.25 | 0.25 | 0.2 | 0.35 | 0.25 | 0.25 | 0.5 | 0.8 | 0.8 | 0.8 |
|  | Adhesiveness at the time of heating (kN/m) | 0.1 | 0.6 | 0.6 | 0.6 | 0.6 | 0.6 | 0.6 | 0.6 | 0.6 | 0.6 | 0.6 | 0.6 | 0.6 | 0.6 |
|  | CTE (ppm/° C.) | 3 | 3 | 5 | 3 | 2 | 2 | 3 | 3 | 3 | 3 | 3 | 3 | 3 | 3 |
|  | Modulus of elasticity (GPa) | 30 | 30 | 35 | 33 | 25 | 25 | 30 | 30 | 20 | 40 | 30 | 30 | 30 | 30 |

TABLE 1-continued

| | Examples | | | | | | | | | | Comparative Examples | | | |
|---|---|---|---|---|---|---|---|---|---|---|---|---|---|---|
| | 1 | 2 | 3 | 4 | 5 | 6 | 7 | 8 | 9 | 10 | 1 | 2 | 3 | 4 |
| Formability | A | A | A | A | A | B | A | A | A | B | A | A | A | A |
| Via shape | A | A | A | A | A | A | B | A | A | A | A | A | A | A |

What is claimed is:

1. A metal-clad laminated plate for a printed wiring board having a through hole, the metal-clad laminated plate comprising:
   an insulating layer containing a hardened material of a thermosetting resin composition; and
   a metal foil, wherein:
   the thermosetting resin composition comprises:
      a thermosetting resin,
      a hardener, and
      silica particles having an average particle diameter equal to or greater than 0.2 μm and treated with isocyanate,
   the printed wiring board has a first surface and a second surface opposite to the first surface, and the through hole connects the first surface and the second surface, and
   a modulus of elasticity of the insulating layer is in a range of 30 GPa to 50 GPa.

2. An insulating sheet formed of an insulating layer containing a hardened material of a thermosetting resin composition, the insulating sheet used to a printed wiring board having a through hole, wherein:
   the thermosetting resin composition comprises:
      a thermosetting resin,
      a hardener, and
      silica particles having an average particle diameter equal to or greater than 0.2 μm and treated with isocyanate,
   the printed wiring board has a first surface and a second surface opposite to the first surface, and the through hole connects the first surface and the second surface, and
   a modulus of elasticity of the insulating sheet is in a range of 30 GPa to 50 GPa.

3. A printed wiring board comprising:
   an insulating layer containing a hardened material of a thermosetting resin composition;
   conductive wiring; and
   a through hole, wherein:
   the thermosetting resin composition comprises:
      a thermosetting resin,
      a hardener, and
      silica particles having an average particle diameter equal to or greater than 0.2 μm and treated with isocyanate, and
   a modulus of elasticity of the insulating layer is in a range of 30 GPa to 50 GPa.

4. A prepreg for an insulating layer used to a printed wiring board having a through hole, the prepreg comprising:
   a thermosetting resin composition having silica particles having an average particle diameter equal to or greater than 0.2 μm and treated with isocyanate, wherein:
   the thermosetting resin composition includes an epoxy resin,
   the content of the silica particles treated with the isocyanate is equal to or higher than 67% by mass with respect to the epoxy resin,
   the printed wiring board has a first surface and a second surface opposite to the first surface,
   the through hole connects the first surface and the second surface, and
   after hardening the thermosetting resin composition, a modulus of elasticity of the insulating layer is in a range of 30 GPa to 50 GPa.

5. The metal-clad laminated plate according to claim 1, wherein
   a content of the silica particles is in range of 40% by mass to 320% by mass with respect to a combination of the thermosetting resin and the hardener.

6. The insulating sheet according to claim 2, wherein
   a content of the silica particles is in range of 40% by mass to 320% by mass with respect to a combination of the thermosetting resin and the hardener.

7. The printed wiring board according to claim 3, wherein
   a content of the silica particles is in range of 40% by mass to 320% by mass with respect to a combination of the thermosetting resin and the hardener.

* * * * *